United States Patent [19]

Tabasky et al.

[11] Patent Number: 5,045,346
[45] Date of Patent: Sep. 3, 1991

[54] METHOD OF DEPOSITING FLUORINATED SILICON NITRIDE

[75] Inventors: Marvin J. Tabasky, Peabody, Mass.; Bruce Tweed, Pelham, N.H.

[73] Assignee: GTE Laboratories Incorporated, Waltham, Mass.

[21] Appl. No.: 560,688

[22] Filed: Jul. 31, 1990

[51] Int. Cl.$^5$ ............................................... B05D 3/06
[52] U.S. Cl. ........................................ 427/39; 427/38; 427/255.2; 427/255.1; 427/255
[58] Field of Search ............. 427/39, 38, 248.1, 255.2, 427/255.1, 255; 118/723

[56] References Cited

U.S. PATENT DOCUMENTS 4,514,437 4/1985 Nath ....................................... 427/39
4,960,656 10/1990 Chang et al. .......................... 428/704

FOREIGN PATENT DOCUMENTS 60-36343 2/1985 Japan.

OTHER PUBLICATIONS

C-P Chang et al., Fluorinated Chemistry for High-Quality Low Hydrogen Plasma-Depositte Silicon Nitride Films, J. Appl. Phys. 62(4), Aug. 15, 1987, pp. 1406–1415.

S. Fujita et al., Electrical Properties of Silicon Nitride Films Plasma-Deposited from $SIF_4$, $N_2$, and $H_2$ Source Gases, J. Appl. Phys. 57(2), Jan. 1985, pp. 426–431.

Primary Examiner—Shrive Beck
Assistant Examiner—Roy V. King
Attorney, Agent, or Firm—Victor F. Lohmann, III

[57] ABSTRACT

Method of forming a fluorinated silicon nitride film on a semiconductor substrate by first forming a coating of ammonium hexafluorosilicate on the electrode of a plasma reactor to serve as a source of fluorine during the silicon nitride deposition procedure. The ammonium hexafluorosilicate coating is formed by generating a plasma of carbon tetrafluorine and oxygen within the reactor, then a plasma of nitrogen, followed by a plasma of silane and helium with nitrogen. The substrate is then placed in the reactor and a plasma employing silane and helium together with nitrogen is generated at low RF frequency to produce a fluorinated silicon nitride film on the substrate.

16 Claims, 1 Drawing Sheet

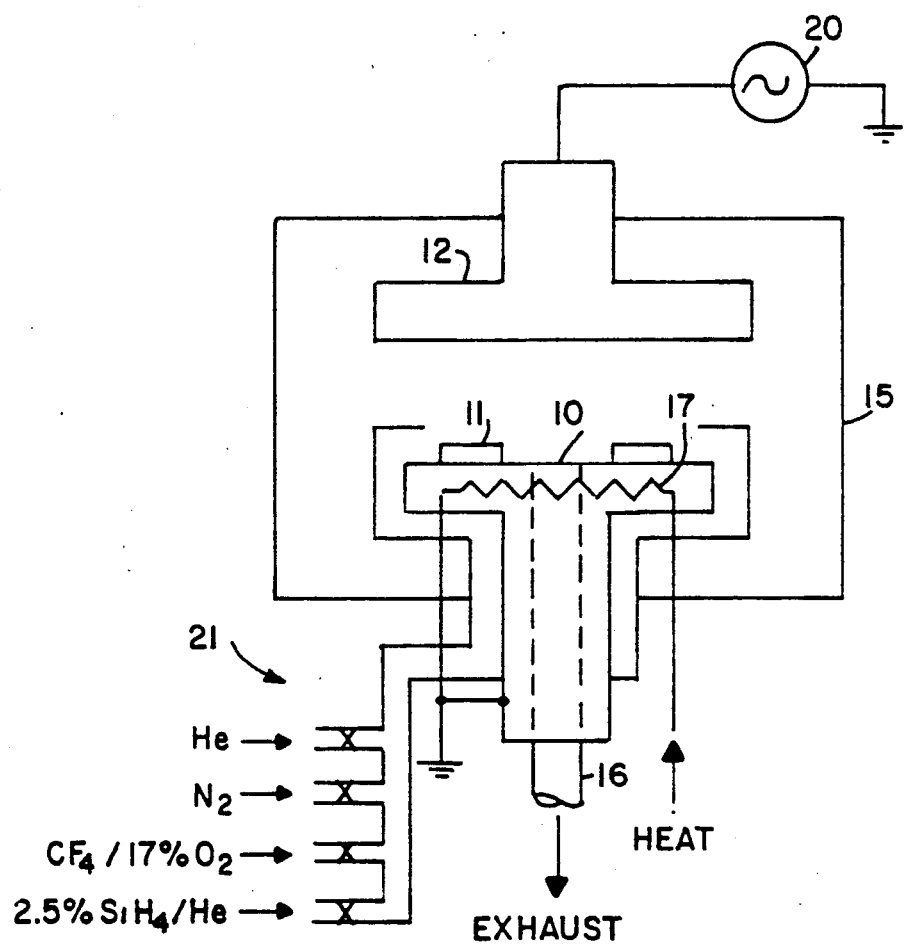

METHOD OF DEPOSITING FLUORINATED SILICON NITRIDE

BACKGROUND OF THE INVENTION

This invention relates to methods of producing semiconductor devices. More particularly, it is concerned with methods of depositing silicon nitride films on substrates in the manufacturing of semiconductor devices.

Silicon nitride films are widely used in the manufacture of semiconductor devices and integrated circuits. Plasma deposition of silicon nitride is a relatively low temperature process which is used frequently so as not to cause harmful effects to previously fabricated device structures. Such a process is particularly desirable for the deposition of final passivating films for protecting the device surfaces.

In the past silicon nitride films have been plasma deposited by employing a gaseous mixture of silane and ammonia together with a suitable carrier gas such as argon, helium, or nitrogen and using a high frequency RF plasma. High frequency RF plasma techniques frequently produce a deposited film which is under tensile stress causing cracks in the film upon subsequent high temperature manufacturing operations. Films deposited by this method may also contain impurities resulting from the difficulty in purifying the ammonia reactant. In addition ammonia/silane nitride films have a considerable amount of hydrogen incorporated in the deposited film. When these films are an integral part of the active device structure, the incorporated hydrogen has been shown to be detrimental to device stability. When these films are applied as the final protective passivation layers on MOS devices, the hydrogen atoms can diffuse into the gate oxide and create traps for hot electrons.

Because of these problems, there have been efforts to reduce the amount of hydrogen in plasma deposited silicon nitride films. Nitrogen has been substituted for ammonia as the nitrogen source during the deposition step. In other efforts to reduce the concentration of hydrogen, fluorine in the form of $SiF_4$, $NF_3$, or $F_2$ has been employed as a reactant in addition to the silane during the deposition process. The purpose of the fluorine is to replace relatively weak Si-H bonds with stronger Si-F bonds to improve the deposited silicon nitride film. In addition, efforts have been made to change the stress in the deposited film from tensile to compressive by using low frequency, typically below 1MHz, rather than high frequency RF for generating the plasma.

SUMMARY OF THE INVENTION

The method of depositing improved silicon nitride films on a substrate in accordance with the present invention comprises positioning an electrode having a coating containing fluorine and silicon in a reaction chamber and placing a substrate on a support in the chamber. Silane and nitrogen are introduced into the chamber and RF electrical energy is applied between the electrode and the support to generate a reactive plasma within the chamber. A fluorinated silicon nitride film is deposited on the substrate.

In another aspect of the present invention, an electrode is placed in a reaction chamber. Carbon, fluorine, and oxygen are introduced into the chamber and a reactive plasma is generated within the chamber. Then, silane and nitrogen are introduced into the chamber and a reactive plasma is generated within the chamber to deposit a coating containing fluorine and silicon on the electrode. A substrate is placed on a support in the chamber. Silane and nitrogen are introduced into the chamber and RF electrical energy is applied between the electrode and the support to generate a reactive plasma within the chamber. A fluorinated silicon nitride film is deposited on the substrate.

BRIEF DESCRIPTION OF THE DRAWINGS

In the drawing:

The sole figure is a schematic representation of plasma deposition apparatus employed in carrying out the method of the invention.

For a better understanding of the present invention, together with other and further objects, advantages, and capabilities thereof, reference is made to the following disclosure and appended claims in connection with the above-described drawing.

DETAILED DESCRIPTION

In the following discussion the method in accordance with the present invention is employed to deposit a fluorinated silicon nitride film as a protective passivation layer on silicon wafers containing junction field effect transistors.

A schematic representation of the apparatus employed is illustrated in the sole figure of the drawing. The apparatus is a conventional RF plasma deposition system. Specifically, a Plasma-Therm PK1232 reactor which is manufactured by Plasma-Therm Inc., Route 73, Kresson, N.J. 08053. The apparatus includes a support 10 for substrates 11 to be treated and an electrode 12 positioned opposite the support 10. The support 10 and electrode 12 are typically of aluminum, are 10 inches in diameter, and are spaced apart 0.7 inch under operating conditions. These elements are positioned within a chamber 15 which can be sealed. The chamber 15 is exhausted through an exhaust port 16 centrally of the support 10. Reactant gases are admitted at the periphery of the upper surface of the support 10 by way of inlets 21. A heating element 17 is mounted within the support 10 for heating the substrate 11. An RF generator 20 provides RF energy between the electrode 12 and support 10 to form a reactive plasma within the chamber 15.

Prior to placing the substrate 11 which is to be coated with a silicon nitride film in the apparatus, the electrode 12 is prepared by forming a coating containing fluorine and silicon, specifically ammonium hexafluorosilicate, on the surface of the electrode 12 facing the substrate support 10. A mixture of carbon tetrafluoride and oxygen, $CF_4$ $17\%O_2$, is introduced into the chamber 15 at a rate of 100 cc per minute. The pressure within the chamber is reduced to 400 millitorr, the support 10 is heated to 350° C., and RF energy of 275 watts at 100 KHz is applied to form a reactive plasma. This treatment is maintained for 1 hr and introduces a large quantity of fluorine into the system. Next, nitrogen, $N_2$, is introduced at a rate of 200 cc per minute with the pressure maintained at 900 millitorr, the temperature at 350° C., and RF energy of 115 watts for a period of 1 hr. This procedure reduces the residual oxygen left from the presence of oxygen in the previous step and removes some of the excess fluorine.

In order to remove gaseous materials from the chamber, helium is admitted at a rate of 500 cc per minute under a pressure of 900 millitorr and support temperature of 350° C. for 15 minutes. After this cleaning step, a mixture of silane and helium which is 2.5% SiH$_4$ He is admitted to the chamber at a rate of 100 cc per minute together with nitrogen, N$_2$, at a rate of 200 cc per minute. Thus providing a ratio of 2.5 cc SiH$_4$/200 cc N$_2$ or 0.012 SiH$_4$/N$_2$ parts per volume of silane with respect to nitrogen. The pressure is 900 millitorr and the temperature is 350° C. A plasma is formed by applying RF energy of 50 watts at 100 KHz for a period of 15 minutes. Subsequent to this treatment, the chamber is flushed with helium at a rate of flow of 500 cc per minute at a pressure of 900 millitorr and temperature of 350° C. for a period of 1 hr.

As a result of the foregoing procedures the electrode 12 and also the support 10 are coated with material containing fluorine and silicon, specifically ammonium hexafluorosilicate. This material serves as a source of fluorine during subsequent plasma deposition of silicon nitride on substrate wafers.

In the process of depositing silicon nitride films one or more substrates 11 which may be wafers of silicon of standard 3 inch diameter are placed on the support 10. Specifically, the wafers may incorporate junction field effect transistors of the static induction type which are to receive a final protective passivation film of silicon nitride. The pressure within the chamber 15 is reduced to 20 millitorr and the temperature of the support 10 is maintained at 350° C. for 1 minute. Helium is introduced at a rate of 500 cc per minute at a pressure of 250 millitorr and the temperature is maintained at 350° C. for 1 minute. The steps of reducing the pressure to 20 millitorr and introducing helium at a rate of 500 cc per minute at 250 millitorr is repeated two more times. Then, the pressure within the chamber is reduced to 20 millitorr and maintained at that pressure for 5 minutes with the temperature at 350° C. The foregoing procedure removes water vapor from the system in preparation for the deposition of silicon nitride.

A mixture of silane and helium, 2.5% SiH$_4$ He is introduced at a rate of 100 cc per minute and nitrogen, N$_2$, is introduced at a rate of 200 cc per minute. The pressure is maintained at 900 millitorr and the temperature at 350° C. RF energy of 50 watts is applied at a frequency of 100 KHz. Under these conditions silicon nitride deposits on the upper surfaces of the substrate at the rate of 60 Angstroms per minute.

Analysis of deposited silicon nitride films has shown the presence of fluorine in amounts of between 6 and 8 atomic percent. The fluorine atoms are uniformly distributed throughout the film. The deposited films are of uniform thickness within 2 to 5%, both from wafer to wafer within the same run and from run to run. The fluorinated silicon nitride films are compressively stressed and remain free of cracks after subsequent high temperature treatment. In addition, pinhole densities in the films are low and the films provide excellent step coverage on uneven substrate surfaces. Furthermore, the resulting fluorinated silicon nitride films are readily etched either by employing conventional plasma or chemical etching procedures.

While there has been shown and described what is considered a preferred embodiment of the present invention, it will be obvious to those skilled in the art that various changes and modifications may be made therein without departing from the invention as defined by the appended claims.

WHAT IS CLAIMED IS:

1. The method of depositing silicon nitride on a substrate comprising:

positioning an electrode having a coating containing fluorine and silicon in a reaction chamber;
   placing said substrate on a support in said chamber;
   introducing silane and nitrogen into said chamber; and
   applying RF electrical energy between said electrode and said support to generate a reactive plasma within the chamber and deposit fluorinated silicon nitride on said substrate.

2. The method in accordance with claim 1 wherein said coating contains a compound of fluorine and silicon.

3. The method in accordance with claim 2 wherein the frequency of said RF electrical energy is about 100 KHz.

4. The method in accordance with claim 3 wherein introducing silane and nitrogen into said chamber includes:

introducing a mixture of silane and helium and introducing nitrogen at a ratio of 0.012 parts per volume of silane with respect to nitrogen.

5. The method in accordance with claim 4 wherein said coating contains ammonium hexafluorosilicate.

6. The method in accordance with claim 5 wherein said substrate is of semiconductor material.

7. The method in accordance with claim 6 wherein said substrate is of silicon.

8. The method of depositing silicon nitride on a substrate comprising:

placing an electrode in a reaction chamber;
   introducing carbon, fluorine, and oxygen into said chamber;
   generating a reactive plasma within said chamber;
   introducing silane and nitrogen into said chamber;
   generating a reactive plasma within said chamber to deposit a coating containing fluorine and silicon on said electrode;
   placing said substrate on a support in said chamber;
   introducing silane and nitrogen into said chamber; and
   applying RF electrical energy between said electrode and said support to generate a reactive plasma within the chamber and deposit fluorinated silicon nitride on said substrate.

9. The method in accordance with claim 8, wherein subsequent to introducing carbon, fluorine, and oxygen into said chamber and generating a reactive plasma and prior to introducing silane and nitrogen into said chamber:
   introducing nitrogen into said chamber; and generating a reactive plasma within said chamber.

10. The method in accordance with claim 9 wherein introducing carbon, fluorine, and silicon comprises:
    introducing carbon tetrafluoride and oxygen.

11. The method in accordance with claim 10 wherein subsequent to introducing nitrogen into said chamber and
    generating a reactive plasma with said chamber: introducing helium into said chamber; and generating a reactive plasma within said chamber.

12. The method in accordance with claim 11 wherein subsequent to generating a reactive plasma within said chamber to deposit a coating containing fluorine and silicon on said electrode and prior to placing said substrate on a support in said chamber: purging said chamber with helium.

13. The method in accordance with claim 12 wherein the frequency of said RF electrical energy is about 100 KHz 14. The method in accordance with claim 13 wherein introducing silane and nitrogen into said chamber includes:
   introducing a mixture of silane and helium and introducing nitrogen at a ratio of 0.012 parts per volume of silane with respect to nitrogen.

15. The method in accordance with claim 14 wherein said substrate is of semiconductor material.

16. The method in accordance with claim 15 wherein said substrate is of silicon.

* * * * *